United States Patent [19]
Gabriel

[11] Patent Number: 5,730,834
[45] Date of Patent: Mar. 24, 1998

[54] FLUORINE RESIDUE REMOVAL AFTER TUNGSTEN ETCHBACK

[75] Inventor: Calvin Gabriel, Cupertino, Calif.

[73] Assignee: VLSI Technology, Inc., San Jose, Calif.

[21] Appl. No.: 625,742

[22] Filed: Mar. 29, 1996

[51] Int. Cl.[6] .................................................. H01L 21/00
[52] U.S. Cl. ........................... 156/643.1; 156/656.1; 437/192
[58] Field of Search ........................... 156/643.1, 651.1, 156/656.1, 657.1, 659.11, 662.1, 345 PC; 437/187, 192, 228 PE; 134/1.3, 30

[56] References Cited

U.S. PATENT DOCUMENTS 5,200,017  4/1993  Kawasaki et al. .................... 156/345

OTHER PUBLICATIONS

Roede, Henk, et al.; "The Effect of Post W–Etchback Cleaning Treatments and Implementation of Refractory Metal Buffer Layers on the Electro-migration Performance of TiN/AlCu/TiN/Ti Metallization Systems"; *Procedures MRS Spring Meeting*, San Francisco, Apr. 1995.

Mihara, Satoru and Moritaka Nakamura; "Mechansim of Plug Loss Suppression in Tungsten Etcback process by a Redeposition of Titanium reaction Products"; *Proc. 10th Symp. on Plasma Processing;* Electrochemical Society, Pennington, New Jersey; 1994; pp. 449–459.

*Primary Examiner*—William Powell
*Attorney, Agent, or Firm*—Majestic, Parsons, Siebert & Hsue

[57] ABSTRACT

Forming tungsten plugs allows for a conformal step coverage into contacts in semiconductor wafer processing. By rinsing the wafers after the tungsten etchback but before the wafers have a chance to enter an oxygen-containing environment, the amount of fluorine-containing residue removed from the wafer can be increased. In this way, the connection between the tungsten plugs and a metallization layer can be improved.

20 Claims, 3 Drawing Sheets

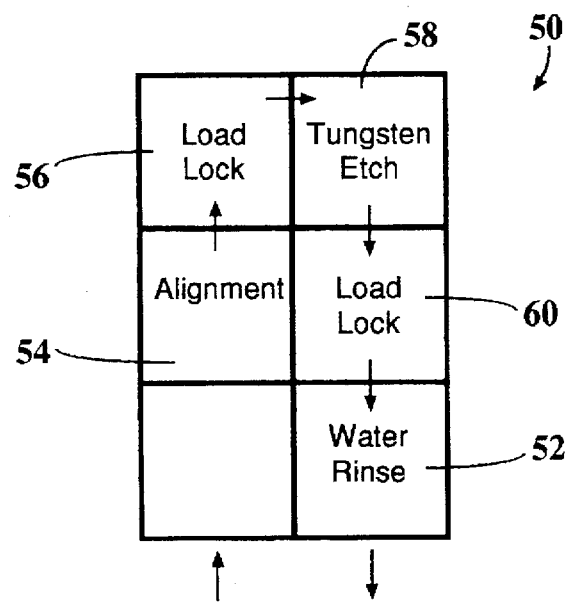
FIG._4.
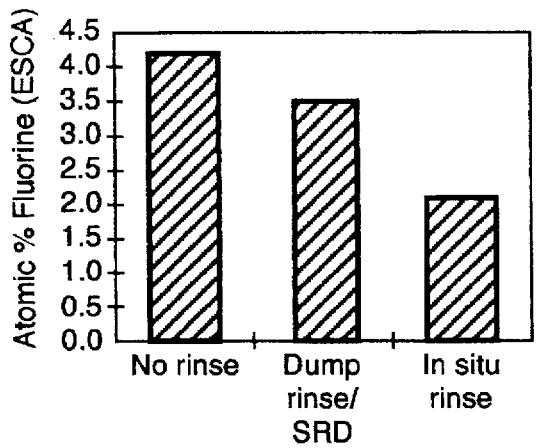
FIG._5A.
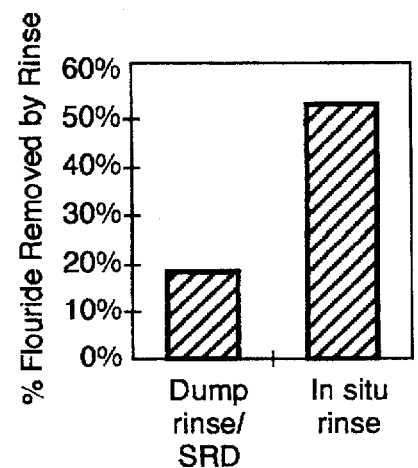
FIG._5B.

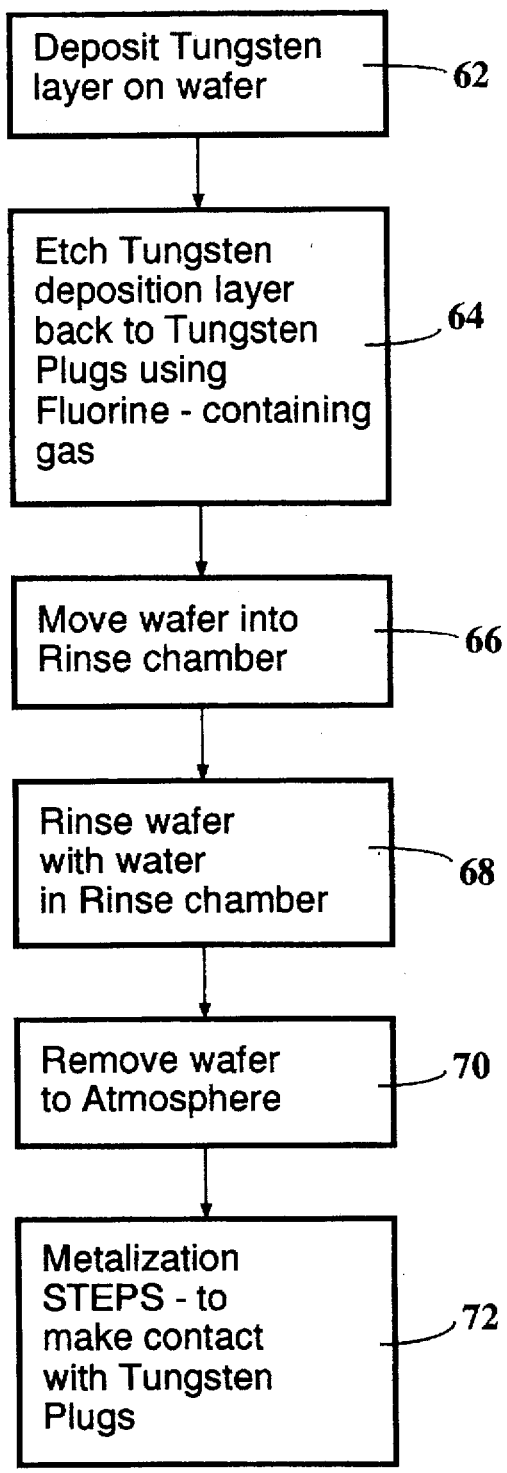
FIG._6.

1

FLUORINE RESIDUE REMOVAL AFTER TUNGSTEN ETCHBACK

BACKGROUND OF THE INVENTION

The present invention relates to a method of removing residue from tungsten plugs before forming a metallization layer to these tungsten plugs on a wafer.

Because of the small dimensions of contact holes in current semiconductor processing techniques, connections in the contact holes are formed with tungsten plugs deposited in a chemical vapor deposition step. This step typically uses a fluorine-containing gas. The tungsten deposited layer is etched back to form the tungsten plugs. The etchback step typically also uses a fluorine-containing gas.

The article, H. Roede et al., "The Effect of Post W-Etchback Cleaning Treatments and Implementation of Refractory Metal Buffer Layers on the Electromigration Performance of TiN/AlCu/TiN/Ti Metallization Systems," *Procedures MRS Spring Meeting*, San Francisco, April 1995, describes different types of cleaning treatments to remove some of the fluorine-containing residue from the tungsten plugs. By removing some of the fluorine-containing residue, the metallization contact to the tungsten plugs has a longer life.

It is desired to have an improved method of removing fluorine-containing residue from the tungsten plugs in order to improve the contact between the tungsten plugs and the metallization layer.

SUMMARY OF THE INVENTION

The Roede et al. reference describes a variety of post-etch treatments which attempt to remove contaminants. These include ammonium hydrogen peroxide bath, argon ion sputtering and water rinse. Currently, the most popular tungsten etching machines are the Applied Materials P5000 and the Lam Research 4720. Neither of these etchers has an internal water rinsing chamber, so that if the wafers are to be rinsed in water, they need to be removed from the etching machines.

The inventors have found that doing a water rinse in a non-oxygen containing environment increases the amount of fluorine-containing residue removed and thus the connection between the tungsten plugs and the metallization layers will likely have a longer life. The applicants have found that much more of the fluorine-containing residue can be removed if the wafer is not moved into a oxygen-containing atmosphere before the rinse step. It is believed that rinsing the wafers with water before putting them into the atmosphere removes some of the fluorine-containing residue before the fluorine-containing residue has a chance to react with oxygen and form oxygen-containing compounds.

BRIEF DESCRIPTION OF THE DRAWINGS

The above and other features and aspects of the present invention will become more apparent upon reading the following detailed description in conjunction with the accompanying drawings, in which:

FIG. 4 is a diagram of a tungsten etching machine having a water rinse chamber.

FIGS. 5A and 5B are graphs comparing the in-situ rinse of the present invention with water rinse after removal from the etching equipment.

FIG. 6 is a flowchart illustrating the method of the present invention.

DETAILED DESCRIPTION OF THE PREFERRED EMBODIMENT

Figure 1:
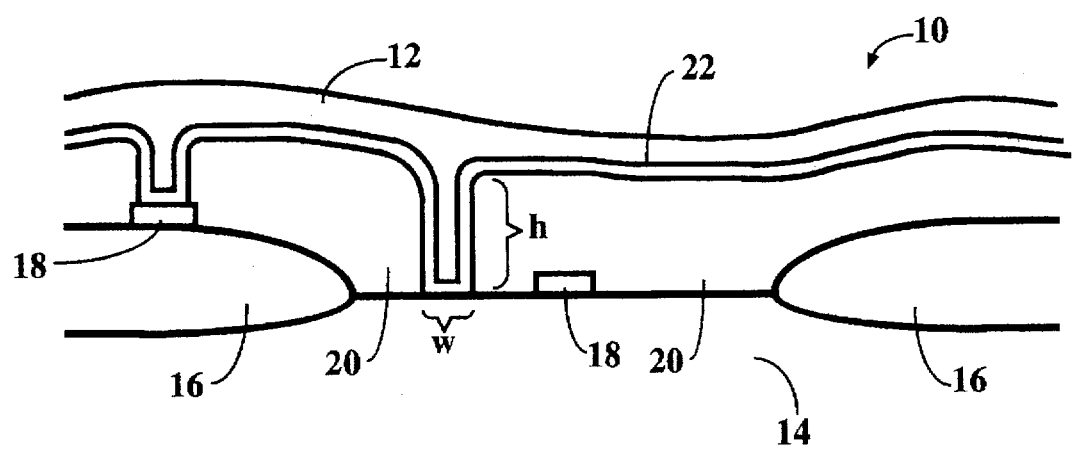
FIG. 1 is a cross-sectional view of a semiconductor wafer showing a tungsten deposition layer.

FIG. 1 is a cross-sectional view of a semiconductor wafer 10 showing a tungsten deposition layer 12. Semiconductor wafer 10 includes a silicon substrate 14, field oxide layers 16, conductive polysilicon interconnects 18, and interlevel dielectric material 20. A glue layer 22 of titanium nitride or titanium tungsten is used to provide a good contact with the tungsten layer 12. In the preferred embodiment, titanium nitride is used as a glue layer 22. The tungsten layer 12 is deposited using a chemical vapor deposition. A problem with the former metal deposition process is that, as the processes get smaller, the aspect ratio h/w of the contact hole shown in FIG. 1 increases and the step coverage will become worse. The step coverage relates to the percentage of the bottom of the contact hole touching the metal.

The advantage of depositing tungsten is that it can be done using chemical vapor deposition to provide conformal step coverage. The deposited tungsten completely fills the contact hole. In the tungsten deposition step, fluorine-containing gases are typically used. In a preferred embodiment, a tungsten fluoride gas ($WF_6$) in an environment of silane gas ($SiH_4$) and/or hydrogen gas reacts to form the solid tungsten.

Figure 2:
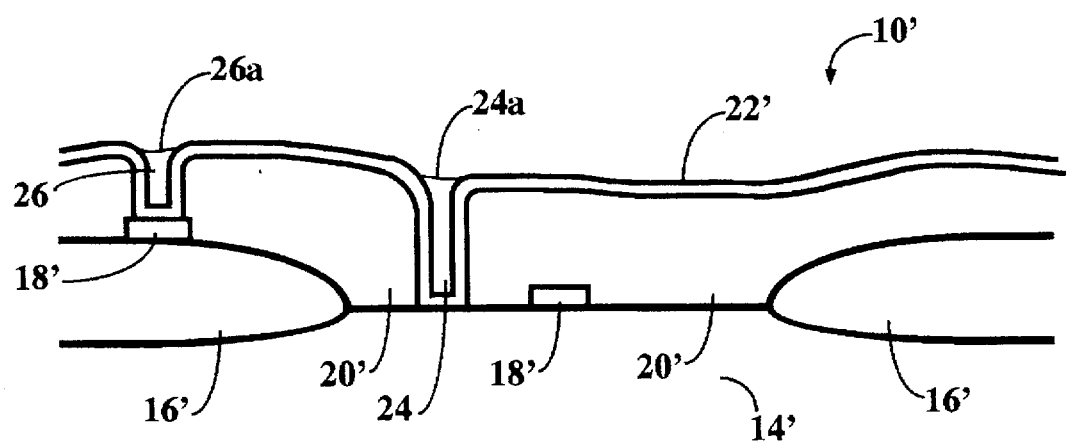
FIG. 2 is a cross-sectional view of a semiconductor wafer showing the tungsten deposition layer etched back to form tungsten plugs.

FIG. 2 is a cross-sectional view of a semiconductor wafer 10' after an etchback to form the tungsten plugs 24 and 26. In the etchback, a fluorine-containing gas such as sulfur hexafluoride ($SF_6$) is used. Sulfur hexafluoride reacts with the tungsten to form a tungsten fluoride gas which is vented away.

In a preferred embodiment, the etchback process begins by doing a bulk etch of 80–90% of the assumed film thickness. The sulfur hexafluoride gas used provides a high etch rate, good uniformity and repeatability. The bulk etch is stopped when the etch reaches the titanium nitride glue layer 22'. This end point can be detected by changes in the etch rate indicated by changes in the tungsten fluoride concentration of the outgoing gases. After the bulk etch, an over etch is used to remove tungsten "stringers." Tungsten "stringers" or "filaments" can occur when there are tungsten residues left behind after tungsten etchback. These residues tend to be long and thin because the conformal tungsten deposition will fill any little grooves in the underlying topography. A "stringer" will tend to form in the groove unless there is a sufficient overetch to clear it away. Because tungsten is conductive, there is a risk that the stringer will cause an electrical short. Optionally, the glue layer 22' can be etched away as well.

A problem with the tungsten etch is that fluoride residues may remain on the surfaces 24a and 26a of the tungsten plugs 24 and 26. The fluorine-containing residues may be a result of a possible reaction with titanium to form titanium fluoride ($TiF_x$). It is at this stage of the wafer processing that the wafer should be rinsed as discussed below.

Figure 3:
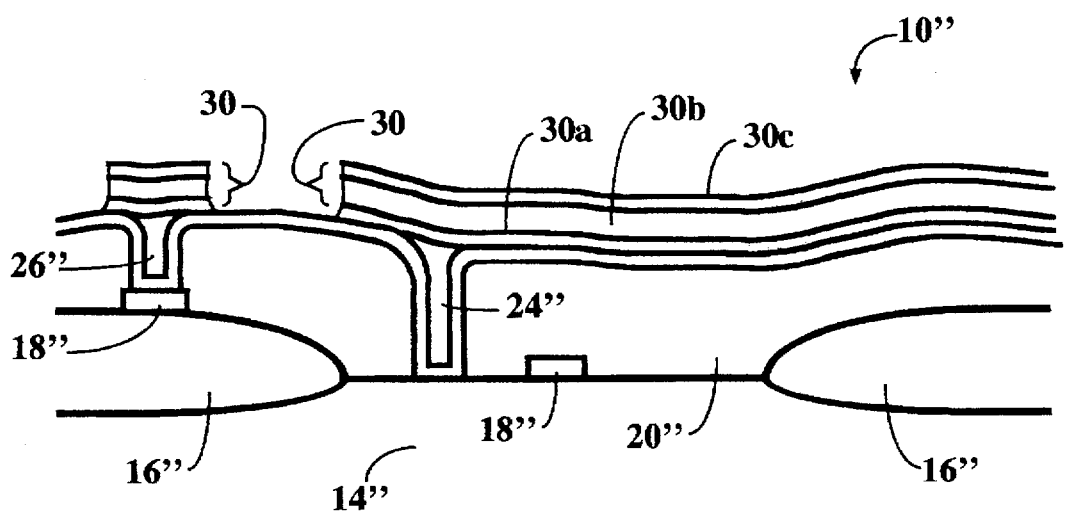
FIG. 3 is a cross-sectional view of a semiconductor wafer showing a metallization layer formed to contact the tungsten plugs.

FIG. 3 is a cross-sectional view of a semiconductor wafer 10" showing a metallization layer 30 connecting to the tungsten plugs 26 and 24. The metallization layer 30 is preferably comprised of a titanium nitride layer 30a, an aluminum with 0.5% copper layer 30b and a top titanium nitride layer 30c. The connection of the metallization layer 30 to the tungsten plugs 24 and 26 can be harmed by the fluorine-containing residue.

FIG. 4 is a diagram of an etching machine 50 with a water rinse chamber 52. Wafers are first placed into the alignment chamber 54 of the tungsten etching machine 50. From the alignment chamber 54, the wafers are moved into the load lock chamber 56. Atmospheric gases are pumped out and non-reactive gases such as argon are pumped into the load lock chamber 56. The wafers are moved from the load lock chamber 56 into the tungsten etch chamber 58. In the tungsten etch chamber 58, the tungsten deposited layer is etched back. Gases are supplied to the tungsten etching chamber 58, including the fluorine-containing gases described above. The tungsten etching chamber 58 typically uses a fluorine-containing gas in the presence of argon or argon and nitrogen. Some etchback processes use oxygen in addition to these other gases. In a preferred embodiment, no oxygen is used in the tungsten etchback.

In a preferred embodiment, the tungsten etchback comprises six sub-steps. In the first step, 160 standard cubic centimeters per minute (sccm) of $SF_6$ and 80 sccm of Argon are flowed into the chamber. The chamber pressure is maintained at 270 millitorr (mT). Step 1 ends when the system is stabilized. In step 2, 14 torrs of pressure for a helium clamp is supplied. The helium clamp helps cool the bottom of the wafer in later steps. In step 3, the main etch, the top electrode is supplied with 400 Watts of power at 13.56 Mhz. The wafer is positioned 6 cm from the top electrode. The top electrode temperature is maintained at 40° C., the bottom electrode at 37° C., and the chamber temperature at 60° C. The end point detection is done by checking the 703 nanometer (nm) wavelength. A five-second average of the emissions at 703 nm is done after thirty seconds from the start of the etch. The end of the main etch is triggered when the emissions at 703 nm reach 115% of this baseline value. Step 4 is an overetch that is done for 60% of the time of the main etch. In step 5, the power to the top electrode, the helium clamp, and the $SF_6$, Argon supplies are turned off. 100 sccm of Nitrogen is supplied and the pressure raised to 2000 mT. Step 5 lasts for ten seconds. In step 6, the chamber is pumped out for ten seconds and then the nitrogen supply stopped.

The wafers are moved from the etching chamber to the load lock chamber 60. In the load lock chamber 60, the gases from the tungsten etching chamber 58 are pumped away so that they do not escape to the atmosphere. The wafers are then moved to the water rinse chamber 52. Since the wafers have not left the etching device 50, the wafers have not encountered an oxygenated atmosphere. In a preferred embodiment, nitrogen gas is supplied into the water rinse chamber 52 to maintain the oxygen-free environment. The water rinse step in chamber 52 is preferably done with water that has been heated above room temperature.

In a preferred embodiment, the wafer is rinsed for sixty seconds in water heated to 50° C. at 500 revolutions per minute (rpm). The wafer is spun dry in a cold nitrogen environment rotating the wafer at 2000 rpm.

The tungsten etching equipment 50 in a preferred embodiment is a modified Lam 4600 etcher available from Lam Research Corporation of Fremont, Calif. This Lam 4600 etcher was originally used for an aluminum etch and had been modified to provide a tungsten-type etch.

FIGS. 5A and 5B are graphs comparing the in-situ rinse of the present invention with a rinse after removal from the etching equipment. In FIG. 5A, an electron spectroscopy for chemical analysis (ESCA) of the wafer surfaces after the tungsten etchback shows that conventional dump rinsing after removing from the etcher followed by spin rinse dry (SRD) does reduce the amount of fluorine-containing residue somewhat from 4.3% atomic fluorine down to 3.5% atomic fluorine. The in-situ rinse of the present invention reduces the percentage of atomic fluorine down to 2%, which is much better than is obtained when the rinse is done after the wafer enters the oxygen containing atmosphere.

FIG. 5B shows the percentage of the fluorine residue removed by the two different types of rinses. These results are shown to illustrate the benefit of an in-situ rinse compared to a rinse done after the wafers enter the oxygen-containing atmosphere.

FIG. 6 is a flowchart showing the method of the present invention. In step 62, tungsten is deposited upon the wafer as shown in FIG. 1. In step 64, the tungsten deposition layer is etched back to form the tungsten plugs using a fluorine-containing gas. In step 66, the wafer is moved into a rinse chamber. In step 68, the wafer is rinsed with water in the rinse chamber. This rinsing step is done without the wafer entering an oxygen-containing environment. In step 70, the wafer is removed from the rinse chamber into the atmosphere. In step 72, the metallization steps to form the metallization contact shown in FIG. 3 are done. Since in step 68, the wafer is rinsed with water before entering an oxygen-containing environment, the lifetime of the metallization contact with the tungsten plugs should be improved.

An alternate embodiment of the present invention uses a rinse in a liquid including ammonium fluoride. In a preferred embodiment, an ethylene glycol and neutral ammonium fluoride mixture having a trade name of NOE ETCH available from Advance Chemical Systems International, Inc. of Milpitas, Calif. can be used. This liquid containing the ammonium fluoride can be used after the wafer enters an oxygen-containing environment. Using this liquid after removing the wafers into the atmosphere does reduce the amount of fluorine-containing residue somewhat from 4.3% atomic fluorine down to 2.1% atomic fluorine. This method has the advantage that the modification of tungsten etchers after their construction to provide a water rinse chamber may be impracticable. The method using the liquid containing the ammonium fluoride has the disadvantages of being more expensive and more time-consuming than the water rinse method.

Various details of the implementation and method are merely illustrative of the invention. It will be understood that various changes in such details may be within the scope of the invention, which is to be limited only by the appended claims.

What is claimed is:

1. A method of processing a wafer, the wafer including a tungsten deposition layer comprising:

etching back the tungsten deposition layer on the wafer in an enclosed processing equipment, the etching step producing fluorine-containing residue on the tungsten as a by-product; and rinsing the wafer in bath in the enclosed processing equipment before exposing the wafer to the atmosphere outside of the processing equipment.

2. The method of claim 1, wherein the rinsing step comprises rinsing the wafer in water.

3. The method of claim 1, wherein the rinsing step is done in an oxygen-free environment.

4. The method of claim 1, wherein the etching and rinsing steps are done in a multiple chamber etcher.

5. The method of claim 4, wherein the rinsing step is done in a separate chamber from the etching step.

6. The method of claim 1, wherein the etching step is done with a fluorine-containing gas.

7. The method of claim 6, wherein the rinsing step includes rinsing the wafer with water heated above room temperature.

8. The method of claim 6, wherein the etching step in an oxygen-free environment.

9. The method of claim 1, wherein the wafer contains a layer including titanium nitride and the rinsing step comprises rinsing a titanium fluoride product from the wafer.

10. The method of claim 1, wherein the etching step comprises etching the tungsten deposition layer back to form tungsten plugs.

11. The method of claim 1, wherein the rising step comprises supplying nitrogen to maintain an oxygen-free environment.

12. The method of claim 1, further comprising a metallization layer deposition step after the rinse step.

13. A method of processing a wafer, the wafer including a tungsten deposition layer comprising:

etching the tungsten deposition layer on the wafer to form tungsten plugs, the etching step producing a fluorine-containing residue on the tungsten plugs as a by-product; and rinsing the wafer in an oxygen-free environment to remove some of the fluorine before exposing the wafer to the atmosphere.

14. The method of claim 1, wherein the rinsing step comprises rinsing the wafer in water.

15. The method of claim 1, wherein the etching and rinsing steps are done in a multiple chamber etcher.

16. The method of claim 1, wherein the etching step is done with a fluorine-containing gas.

17. The method of claim 1, wherein the wafer contains a layer including titanium nitride and the rinsing step comprises rinsing a titanium fluoride product from the wafer.

18. The method of claim 1, further comprising a metallization layer deposition step after the rinse step.

19. The method of claim 1, wherein the rinsing step comprises rinsing in a liquid including ammonium fluoride.

20. A method of processing a wafer, the wafer including a tungsten deposition layer comprising:

etching tungsten on the wafer to form tungsten plugs, the etching step producing a fluorine-containing residue on the tungsten plugs as a by-product; and washing the wafer with a liquid including ammonium fluoride to remove some of the fluorine-containing residue.

* * * * *